United States Patent
Laighton et al.

(10) Patent No.: US 9,685,438 B2
(45) Date of Patent: Jun. 20, 2017

(54) FIELD EFFECT TRANSISTOR HAVING TWO-DIMENSIONALLY DISTRIBUTED FIELD EFFECT TRANSISTOR CELLS

(71) Applicant: Raytheon Company, Waltham, MA (US)

(72) Inventors: Christopher M. Laighton, Boxborough, MA (US); Alan J. Bielunis, Hampstead, NH (US); Istvan Rodriguez, Chelsea, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/830,142

(22) Filed: Aug. 19, 2015

(65) Prior Publication Data

US 2017/0053909 A1   Feb. 23, 2017

(51) Int. Cl.
*H01L 27/088* (2006.01)
*H01L 29/06* (2006.01)
*H01L 29/417* (2006.01)
*H01L 29/423* (2006.01)

(52) U.S. Cl.
CPC ........ *H01L 27/088* (2013.01); *H01L 29/0696* (2013.01); *H01L 29/41758* (2013.01); *H01L 29/4238* (2013.01)

(58) Field of Classification Search
CPC ............... H01L 77/088; H01L 29/0696; H01L 29/41758; H01L 29/4238
USPC ......................................................... 257/393
See application file for complete search history.

(56) References Cited

U.S. PATENT DOCUMENTS

| | | | |
|---|---|---|---|
| 3,969,745 A | 7/1976 | Blocker, III | |
| 4,315,272 A | 2/1982 | Vorhaus | |
| 5,185,534 A | 2/1993 | Sakamoto et al. | |
| 5,376,815 A | 12/1994 | Yokota | |
| 5,539,232 A | 7/1996 | Nakanishi | |
| 5,852,318 A | 12/1998 | Chikamatsu et al. | |
| 6,140,687 A * | 10/2000 | Shimomura | H01L 23/4824 257/390 |
| 6,285,269 B1 | 9/2001 | Ishikawa et al. | |
| 6,576,936 B1 | 6/2003 | Bauer | |
| 2004/0245569 A1* | 12/2004 | Kowalski | G11C 29/02 257/328 |

(Continued)

FOREIGN PATENT DOCUMENTS

DE   26 03 032 A1   8/1977

OTHER PUBLICATIONS

U.S. Appl. No. 14/830,148, filed Aug. 19, 2015, Rodriguez et al.

(Continued)

*Primary Examiner* — Long K Tran
(74) *Attorney, Agent, or Firm* — Daly, Crowley, Mofford & Durkee, LLP

(57) ABSTRACT

A Field Effect Transistor (FET) having: a plurality of FET cells having a plurality of source pads, a plurality of drain pads, and a plurality of gate electrodes disposed on a surface of a substrate; each one of the FET cells having a corresponding one of the gate electrodes disposed between one of the source pads and one of the drain pads; a gate contact connected to the gate electrodes of each one of the FET cells; a drain contact connected to the drain pad of each one of the FET cells; and a source contact connected to source pad of each one of the FET cells. The cells are disposed on a surface in a two-dimensional array.

9 Claims, 5 Drawing Sheets

(56) References Cited

U.S. PATENT DOCUMENTS

| | | | |
|---|---|---|---|
| 2006/0273407 A1* | 12/2006 | Iwata | G11C 7/12 |
| | | | 257/393 |
| 2012/0086082 A1* | 4/2012 | Malinge | H01L 27/11 |
| | | | 257/368 |
| 2014/0175514 A1 | 6/2014 | Darwish et al. | |
| 2014/0286097 A1* | 9/2014 | Lue | H01L 21/28273 |
| | | | 365/185.09 |
| 2015/0054034 A1 | 2/2015 | Chiu et al. | |
| 2015/0194429 A1* | 7/2015 | Moroz | H01L 21/82382 |
| | | | 257/369 |

OTHER PUBLICATIONS

U.S. Appl. No. 14/830,148 Response to Office Action filed Aug. 15, 2016.
Response to Office Action dated Nov. 2, 2016, U.S. Appl. No. 14/830,148, 12 pages.
Final Office Action dated Oct. 31, 2016, U.S. Appl. No. 14/830,148, 11 pages.
Invitation to Pay Additional Fees and, Where Applicable, Protest Fees, PCT/US2016/046106, dated Oct. 24, 2016, 7 pages.
PCT Notification of Transmittal of International Search Report and the Written Opinion of the International Searching Authority, or the Declaration, PCT/US2016/046105; Oct. 24, 2016, 1 page.
PCT International Search Report, PCT/US2016/046105; Oct. 24, 2016, 4 pages.
PCT Written Opinion of the ISA, PCT/US2016/046105; Oct. 24, 2016, 6 pages.

* cited by examiner

FIELD EFFECT TRANSISTOR HAVING TWO-DIMENSIONALLY DISTRIBUTED FIELD EFFECT TRANSISTOR CELLS

TECHNICAL FIELD

This disclosure relates generally to Field Effect Transistors (FETs) and more particularly to improved layouts for such FETs.

BACKGROUND

As is known in the art, Field Effect Transistors (FETs) having a linear array of a plurality of FET cells are used in many applications. Each one of the FET cells has a source, a drain and a gate between the source and the drain to control a flow of carriers along a channel between the source and drain. It should also be understood the source and drain may be reversed in any electrical circuit application; with, in either circuit application, the gate controlling the flow of carriers between a source and a drain.

As is also known in the art, in some FETs, the gates are parallel finger-like gates interconnected to a common gate contact on the top surface of a substrate. Likewise, the individual drains connected to a common drain contact electrode and the sources are connected to a common source contact using the air bridges over the gate fingers and over either the drains, or over the sources, and with the air bridges connected at their ends to a common drain, or source, contact (not shown) on the bottom surface of the substrate with conductive vias passing vertically through the substrate between the ends of the air bridge and the contact on the bottom surface. One such FET with the air bridges over the drains is shown in FIG. 1. Generally, many of these are FET cells are stacked together in a linear array in the output stage of a power amp Monolithic Microwave Integrated Circuit (MMIC), as shown in FIG. 2A. The linear stacking of these FET cells determines the linear L dimension size of the MMIC.

SUMMARY

In accordance with the present disclosure, a Field Effect Transistor (FET) is provided having: a plurality of FET cells having a plurality of source pads, a plurality of drain pads, and a plurality of gate electrodes disposed on a surface of a substrate; each one of the FET cells having a corresponding one of the gate electrodes disposed between one of the source pads and one of the drain pads; a gate contact connected to the gate electrodes of each one of the FET cells; a drain contact connected to the drain pad of each one of the FET cells; and a source contact connected to source pad of each one of the FET cells. The cells are disposed on a surface in a two-dimensional array.

The inventors have recognized that the linear arrangement of the FET cells creates 'bunching' of thermal dissipation and creates high channel temperatures in the FET. The inventors solve this problem by disposing the cells in a two-dimensional array.

In one embodiment, FET cells are disposed in a U-shaped arrangement.

In one embodiment, one portion of the cells is disposed along a line and another portion of the cells is disposed along an intersecting line.

In one embodiment, Field Effect Transistor (FET) is provided having: a plurality of finger-like gate electrodes electrically interconnected to successively points along an edge of a common gate contact, a first portion of the finger-like gate electrodes extending along to a vertical direction and a second portion extending along a direction intersecting the vertical direction.

In one embodiment, the direction intersecting the vertical direction is a horizontal direction.

In one embodiment, a third portion of a plurality of finger-like gate electrodes; the first portion and the second portion being connected to opposite edges of the common gate contact.

In one embodiment, a third portion of a plurality of finger-like gate electrodes electrically interconnected to successively points along the common gate contact and extending along the vertical direction; the first portion being connected to points along one portion of the edge of the common gate contact and the second portion being connected to points along an opposite portion of the edge of the common gate contact.

With such an arrangement, the FET cells of the FET are arranged in three sections where the FET gates axe aligned vertically, e.g., along a vertical or y-dimension, in two sections and horizontally in one section. By creating these three sections, the heat generated has more unshared surface area over which to spread and thus dissipate. The layout optimizes phase matching in the gate and drain fingers which maximizes power and efficiency. Each FET cell needs to be typically within 10 degrees in insertion phase from gain input to drain output to maximize power. The power is maximized with no additional DC current therefore increasing efficiency as well. The gain is also maximized by decreasing the source inductance. The total source inductance is defined by the vias to ground and the interconnecting metal on the top of the substrate. In a traditional air bridge, the vertical conductive vias at the ends of the air bridge provide only two vias; here, for example, in the U-shaped embodiment, there are four vias which greatly reduces overall source inductance of the FET. In addition, the cost of the MMIC is reduced because this layout allows for a smaller vertical dimension and smaller overall semiconductor material. The use of a combination of horizontal and vertical extending gates provides a FET with three separate sections all tied to a low source inductance.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 3A:
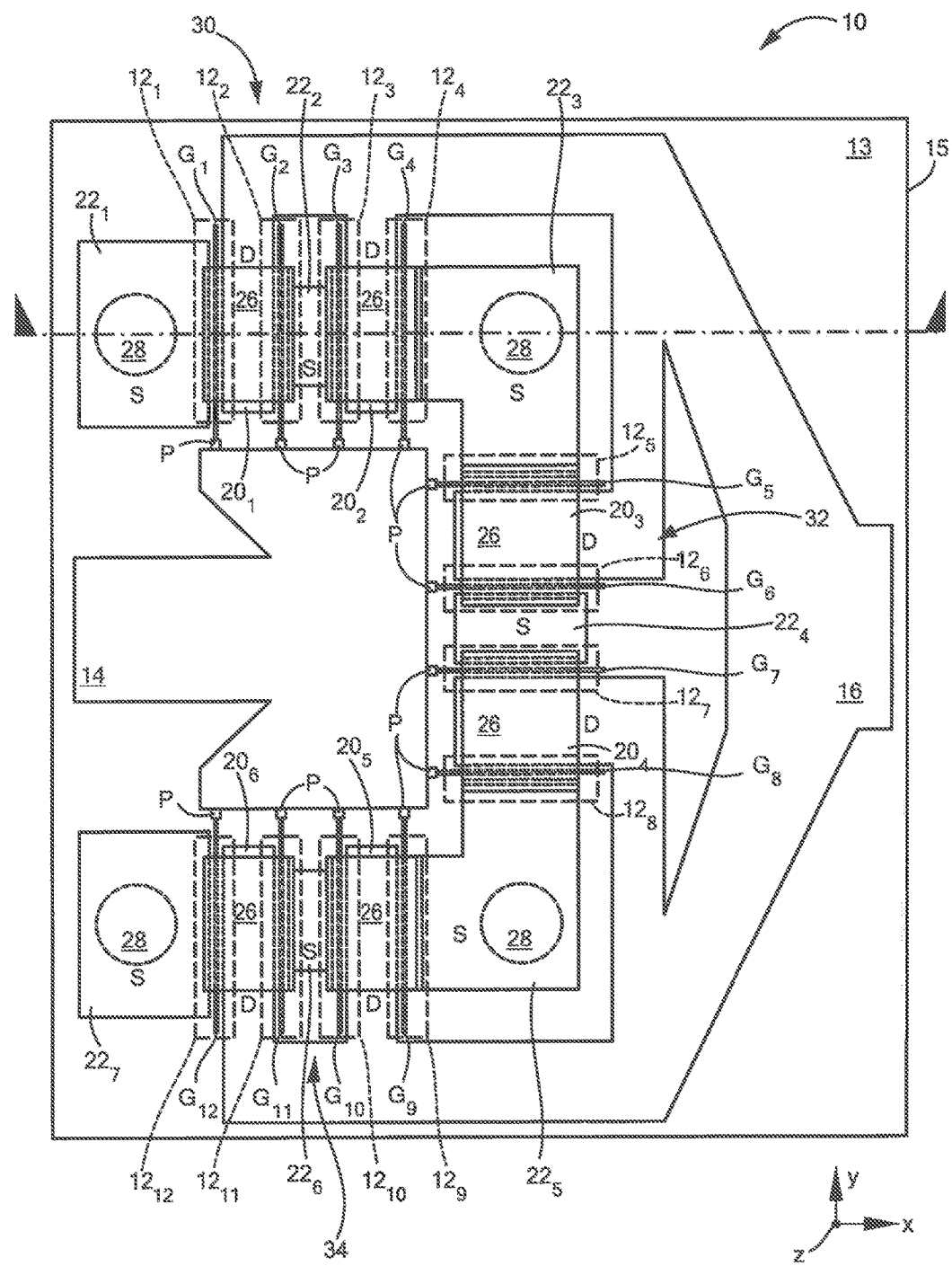
FIG. 3A is a plan view of a Field Effect Transistor (FET) according to the disclosure.
Figure 3B:
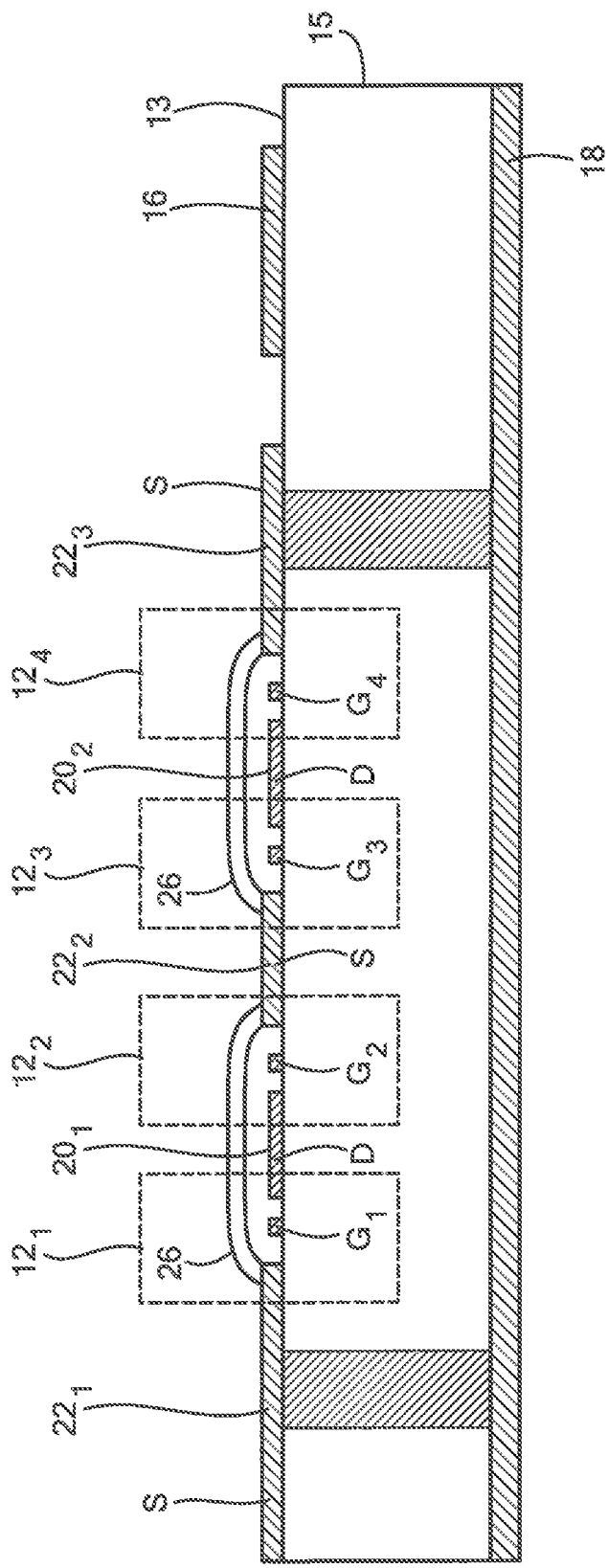
FIG. 3B is a cross sectional sketch of a portion of the FET of FIG. 3A, such cross section being taken along line 3B-3B of FIG. 3A according to the disclosure.
Figure 3C:
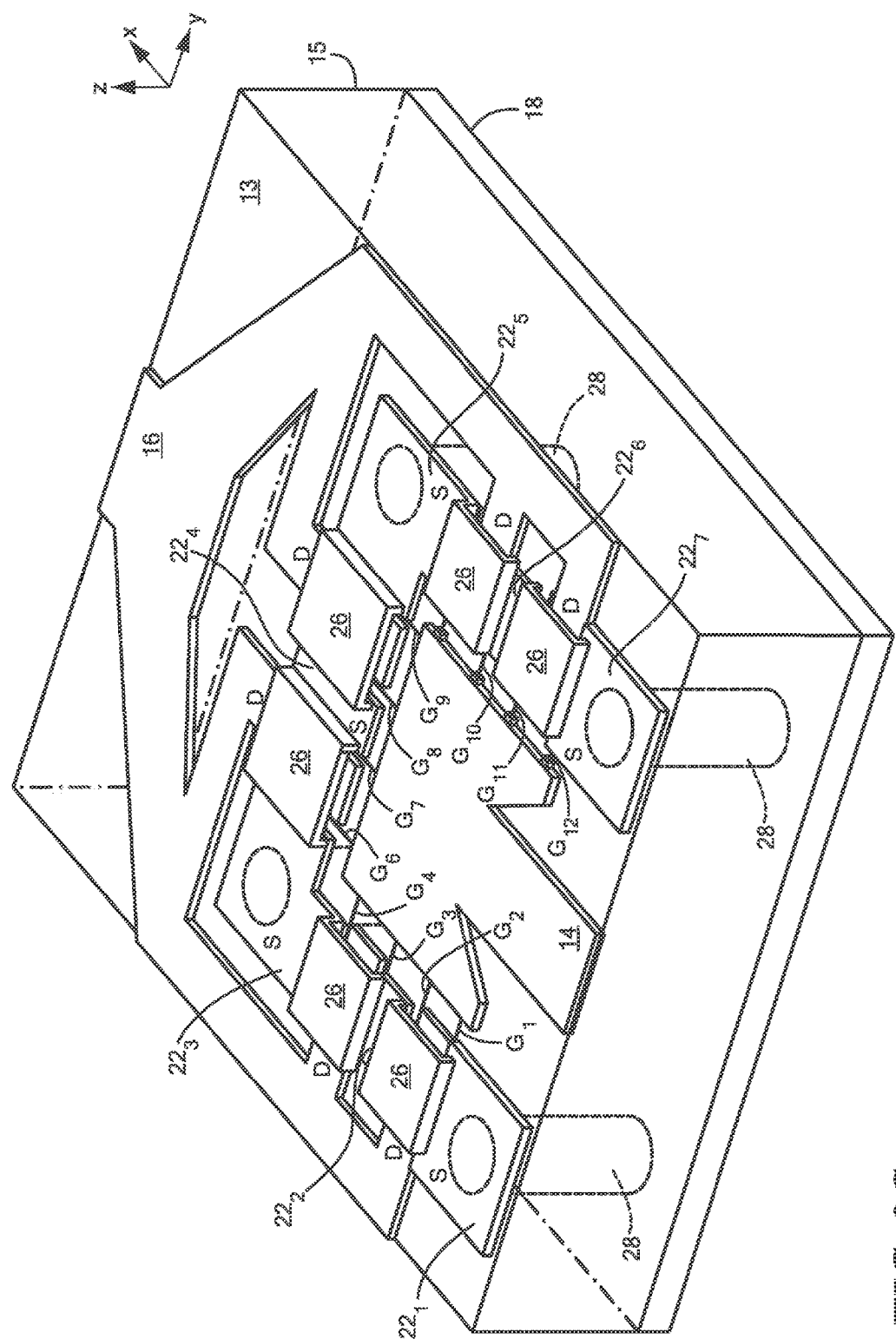
FIG. 3C is an prospective view of the FET of FIG. 3A according to the disclosure.

Referring now to FIGS. 3A-3C, a Field Effect Transistor (FET) 10 is shown to a plurality of, here twelve, FET cells $12_1$-$12_{12}$, each one of the FET cells $12_1$-$12_{12}$ having: a source S; a drain D; and a gate $G_1$-$G_{12}$, respectively, each gate $G_1$-$G_{12}$ here an elongated, finger-like gate, being disposed between the source S and the drain D to control a flow of carriers along a channel between the source S and drain D; FET cells $12_1$-$12_4$ being shown on FIG. 3B. Here, the FET 10 is formed using photo-lithographic chemical etching processing. More particularly, each one of the FET cells $12_1$-$12_{12}$ has, on an upper, planar surface 13 of a semiconductor substrate 15, here for example a substrate having gallium nitride (GaN), a corresponding one of the twelve gate electrodes $G_1$-$G_{12}$, respectively, in Schottky contact with the surface 13 of the semiconductor substrate 15, as shown in FIG. 3A. The FET 10 includes: six drain pads $20_1$-$20_6$ in ohmic contact with the surface 13 of the semiconductor substrate 15; and seven source pads $22_1$-$22_7$ in ohmic contact with the surface 13 of the semiconductor substrate 15, as shown in FIG. 3A. It is noted that each gate finger $G_1$-$G_{12}$ shares a drain (D) provided by one of the drain pads $20_1$-$20_6$ and a source (S) provided by an adjacent one of the source pads $22_1$-$22_7$. Thus, while source pad $22_1$ provides the source (S) for FET cell $12_1$, source pad $22_2$ provides the source (S) for both FET cells $12_2$ and $12_3$; source pad $22_3$ provides the source (S) for both FET cells $12_4$ and $12_5$; source pad $22_4$ provides the source (S) for both FET cells $12_6$ and $12_7$; source pad $22_5$ provides the source (S) both for FET cells $12_8$ and $12_9$; source pad $22_6$ provides the source (S) for both FET cells $12_{10}$ and $12_{11}$; source pad $22_7$ provides the source (S) for FET cell $12_{12}$. Likewise, drain pad $20_1$ provides the drain (D) for both FET cells $12_1$ and $12_2$; drain pad $20_2$ provides the drain (D) for both FET cells $12_3$ and $12_4$; drain pad $20_3$ provides the drain (D) for both FET cells $12_5$ and $12_6$; drain pad $20_4$ provides the drain (D) for both FET cells $12_7$ and $12_8$; drain pad $20_5$ provides the drain (D) for FET cells $12_9$ and $12_{10}$; drain pad $20_6$ provides the drain (D) for FET cells $12_{11}$ and $12_{12}$. Thus, one of the twelve gates $G_1$-$G_{12}$ is disposed between a source (S) and a drain (D) of each one of the FET cells $12_{11}$ and $12_{12}$. Thus, gate G1 is disposed between source pad $22_1$ and drain pad $20_1$; gate G2 is disposed between source pad $22_2$ and drain pad $20_1$; gate G3 is disposed between source pad $22_2$ and drain pad $20_2$; gate G4 is disposed between source pad $22_3$ and drain pad $20_2$; gate G5 is disposed between source pad $22_3$ and drain pad $20_3$; gate G6 is disposed between source pad $22_4$ and drain pad $20_3$; gate G7 is disposed between source pad $22_4$ and drain pad $20_4$; gate G8 is disposed between source pad $22_5$ and drain pad $20_4$; gate G9 is disposed between source pad $22_5$ and drain pad $20_5$; gate G10 is disposed between source pad $22_6$ and drain pad $20_5$; gate G11 is disposed between source pad $22_6$ and drain pad $20_6$; and gate G12 is disposed between source pad $22_7$ and drain pad $20_6$, as shown in FIG. 3A.

The FET 10 includes: a gate contact 14 connected to the gates G1-G12 of each one of the FET cells $12_1$-$12_{12}$; a drain contact 16 connected to each one of the drain pads $20_1$-$20_6$, as shown in FIG. 3A. The source pads $22_1$-$22_7$ are electrically interconnected by air bridges 26 shown more clearly in FIG. 3C. A source contact 18 (FIGS. 3A-3C) is disposed on the bottom of the substrate 15 (FIG. 3B) and is connected to source pads $22_1$, $22_3$, $22_5$ and $22_7$ by conductive vias 28 passing through the substrate 15, as shown in FIGS. 3A-3C.

More particularly, and referring also to FIG. 3B, the cells 14 are disposed on the upper surface 13 of the substrate 15 in a two-dimensional array in an X-Y plane (FIG. 3A and 3B). The finger-like gate electrodes G1-G12 are electrically interconnected to successively points, P, along an edge of the common gate contact 14. It is noted that a first portion 30 of the finger-like gate electrodes G1-G4 extend along to a vertical direction or Y direction (FIG. 3A) and a second portion 32 of the finger-like gate electrodes G5-G8 extending along a direction intersecting the vertical direction, here for example, a horizontal or X direction. It is noted that a third portion 34 of a plurality of finger-like gate electrodes G9-G12 extend along to a vertical direction or −Y direction (FIG. 3A) the first portion 30 and the third portion 34 are connected to opposite edges of the common gate contact 14 and extend in opposite directions. Thus, here in this example, the FET 10 is a U-shaped FET 10.

Figure 1:
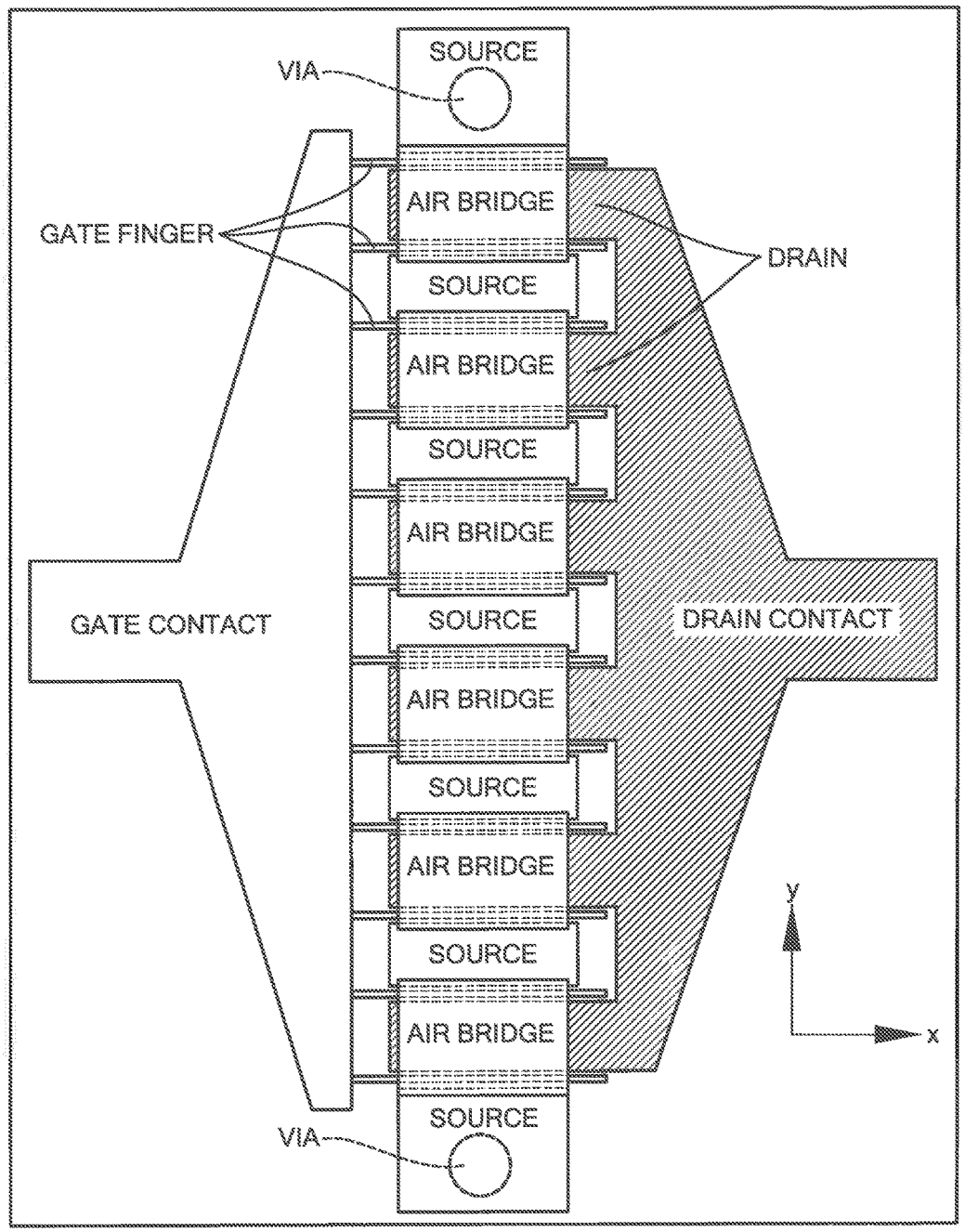
FIG. 1 is a top view of a Field Effect Transistor (FET) according to the PRIOR ART.
Figure 4B:
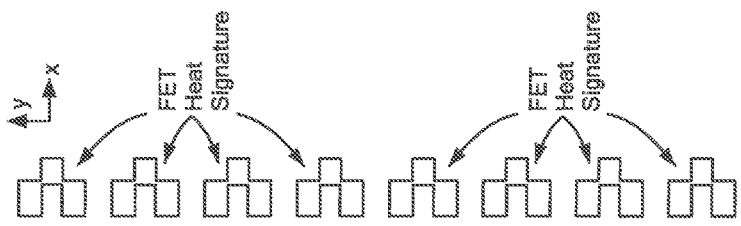
FIG. 4B shows the heat signature or spatial position of each of heat generated by each on the eight FETS in the linear array of FIG. 4A according to the disclosure.
Figure 4A:
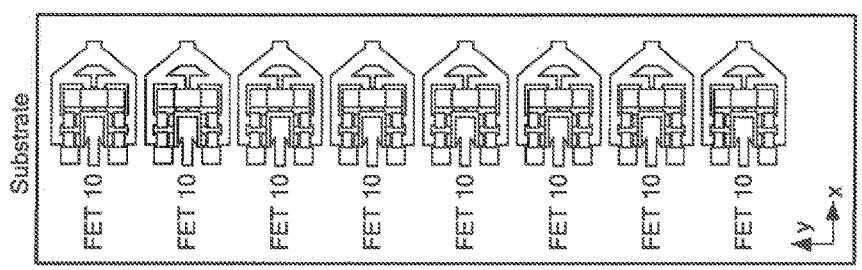
FIG. 4A is a top view of a linear array of, here eight, FETs of FIG. 1 according to the disclosure.
Figure 2B:
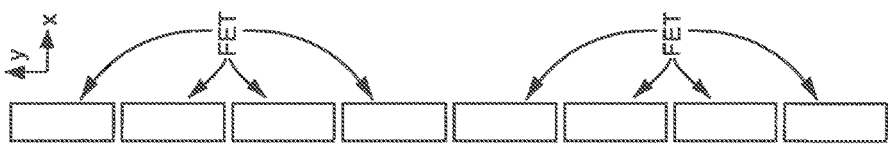
FIG. 2B shows the heat signature or spatial position of heat generated by each on the eight FETS in the linear array of FIG. 2A according to the PRIOR ART.
Figure 2A:
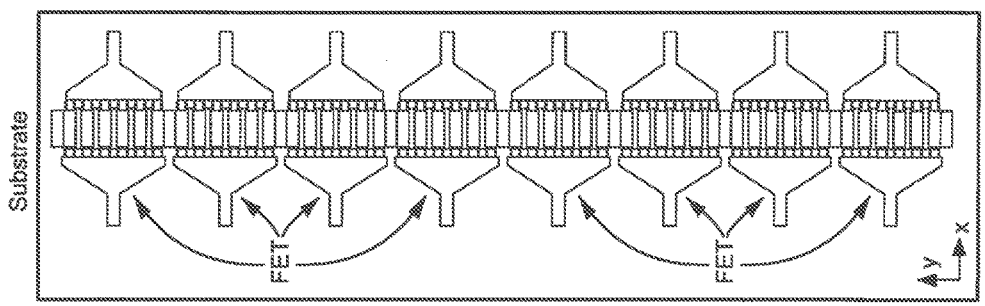
FIG. 2A is a top view of a plan view of a linear array of, here eight, FETs of FIG. 1 according to the PRIOR ART.

Referring now to FIGS. 2A and 4A, it is noted that the vertical dimension (along the Y-axis) of an array of the eight FETs 10, each having twelve FET cells, (FIG. 3A) with the FETs of the FIG. 1, the eight FETs 10 occupy less of the vertical (Y axis) dimension. It is also noted in comparing the heat signature of the array of eight FETs 10 of FIG. 3A, with the heat signature of the array of FETs in FIG. 1 (FIG. 2B), with the array of the FETs 10 of FIG. 3A the heat is distributed in two dimensions (the X and Y directions, FIG. 4B) and therefore the heat generated has more unshared surface area over which to spread and thus dissipate.

A number of embodiments of the disclosure have been described. Nevertheless, it will be understood that various modifications may be made without departing from the spirit and scope of the disclosure. For example, instead of a U-shaped FET cell, other shapes wherein the FET cells are distributed in two dimensions may be used, such as for example, a V-shaped FET cell, a cup-shaped cell, a concave shaped cell, a parabolic shaped cell. Further, the source and drain may be reversed in any electrical circuit application; with, in either circuit application, the gate controlling the flow of carriers between a source and a drain. Accordingly, other embodiments are within the scope of the following claims.

What is claimed is:
1. A Field Effect Transistor (FET), comprising:
a plurality of FET cells having a plurality of source pads, a plurality of drain pads, and a plurality of gate electrodes disposed on a surface of a substrate; each one of the FET cells having a corresponding one of the gate electrodes disposed between one of the source pads and one of the drain pads; a gate contact connected to the gate electrodes of each one of the FET cells, the plurality of gate electrodes being finger-like electrode extending outwardly from the gate contact;
a drain contact connected to the drain pad of each one of the FET cells;
a common source contact connected to source pad of each one of the FET cells;
wherein the cells are disposed on a surface in a two-dimensional array;
wherein a first portion of the FET cells have the gate electrodes thereof control a flow of carriers passing between the drain pads and the source pads of the first portion of the FET cells;

wherein a second portion of the FET cells have the gate electrodes thereof control a flow of carriers passing between the drain pads and the source pads of the second portion of the FET cells; and wherein a plurality of the first portion of the gate electrodes being parallel and extending along a first direction and a plurality of the second portion of the gate electrode being parallel and extending along a second direction, the second direction intersecting the first direction.

2. The Field Effect Transistor (FET) recited in claim 1 wherein the FET cells are disposed in a non-linear array.

3. The Field Effect Transistor (FET) recited in claim 1 wherein the FET cells are disposed in U-shaped arrangement.

4. The Field Effect Transistor (FET) recited in claim 1 wherein one portion of the cells is disposed along a line and another portion of the cells is disposed along an intersecting line.

5. A Field Effect Transistor (FET), comprising:
a plurality of FET cells having a plurality of finger-like gate electrodes, each one of the FET cells having a corresponding one of the plurality of finger-like gate electrodes disposed between a drain pad and a source pad of such one of the FET cells;
a common gate contact disposed in an inner region of the FET; and
wherein the finger-like gate electrodes are interconnected to points disposed successively along an edge of the common gate contact, a plurality of a first portion of the plurality of finger-like gate electrodes being parallel and extending outwardly from the common gate contact towards an outer region of the FET along to a vertical direction and a plurality of a second portion of the plurality of finger-like gate electrodes being parallel and extending outwardly from the common gate contact towards an outer region of the FET along a direction intersecting the vertical direction.

6. The Field Effect Transistor (FET) recited in claim 5 wherein the direction intersecting the vertical direction is a horizontal direction.

7. The Field Effect Transistor recited in claim 5 wherein a third portion of a plurality of finger-like gate electrodes extend outwardly from the common gate contact; and wherein the first portion and the second portion are connected to opposite edges of the common gate contact.

8. The Field Effect Transistor recited in claim 5 wherein a third portion of a plurality of finger-like gate electrodes is electrically interconnected to successively points along the common gate contact and extend outwardly from the common gate electrode along the vertical direction; the first portion being connected to points along one portion of the edge of the common gate contact and the third portion being connected to points along an opposite portion of the edge of the common gate contact.

9. A Field Effect Transistor (FET), comprising:
a plurality of FET cells having a plurality of source pads, a plurality of drain pads, and a plurality of gate electrodes disposed on a surface of a substrate; each one of the FET cells having a corresponding one of the gate electrodes disposed between one of the source pads and one of the drain pads; a common gate contact connected to the gate electrodes of each one of the FET cells;
a drain contact connected to the drain pad of each one of the FET cells;
a source contact connected to source pad of each one of the FET cells;
wherein a plurality of a first portion of the FET cells have the gate electrodes thereof being paralled and control a flow of carriers passing between the drain pads and the source pads of the first portion of the FET cells along a first direction;
wherein a plurality of a second portion of the FET cells have the gate electrodes thereof being parallel and control a flow of carriers passing between the drain pads and the source pads of the second portion of the FET cells along a second direction;
wherein the first direction intersects the second direction; and
wherein the gate electrodes of the first portion of the FET cells and the gate electrodes of the second portion of the FET cells extend outwardly from the common gate contact.

* * * * *